United States Patent

Tsurusaki

[11] Patent Number: 5,868,324
[45] Date of Patent: Feb. 9, 1999

[54] NOZZLE FOR SOLDERING APPARATUS

[75] Inventor: Arata Tsurusaki, Saitama, Japan

[73] Assignee: Sony Corporation, Tokyo, Japan

[21] Appl. No.: 754,705

[22] Filed: Nov. 21, 1996

[30] Foreign Application Priority Data

Nov. 29, 1995 [JP] Japan ................................... 7-310534

[51] Int. Cl.$^6$ ...................................................... B05B 1/00
[52] U.S. Cl. .......................................... 239/598; 239/598
[58] Field of Search .................................. 239/598, 589, 239/590, 577; 228/56.3, 51, 52, 55

[56] References Cited

U.S. PATENT DOCUMENTS

| 1,268,877 | 6/1918 | Orme | 228/51 |
| 2,564,427 | 4/1951 | Rugeris | 228/51 |
| 4,101,077 | 7/1978 | Gibson | 239/598 |
| 5,297,697 | 3/1994 | Boring | 222/83 |

*Primary Examiner*—Andres Kashnikow
*Assistant Examiner*—David Deal
*Attorney, Agent, or Firm*—Frommer Lawrence & Haug, LLP; William S. Frommer

[57] ABSTRACT

A nozzle is able to reliably coat and solder a paste-like solder onto a joined member to be soldered, e.g., a plurality of surfaces of two surfaces or more including a joined corner of a metal plate and a base. In a nozzle (1A) according to the present invention, an inner wall length of a tip end portion (4) of a pipe forming a nozzle body (2) is selected such that one side portion (4A) side is reduced in length and an opposite portion (4B) side opposing the one side portion (4A) side is increased in length and an outlet (5) with a sunken opening (5A) is formed at the tip end portion (4) by progressively approaching an inner wall surface (4b) of the other side portion (4B) side to an inner wall surface (4a) of the one side portion (4A) side. Thus, a paste-like solder (S) to be escaped flows in an oblique direction different from the direction in which a fluid guided by the nozzle body (2) portion flows.

5 Claims, 5 Drawing Sheets

NOZZLE FOR SOLDERING APPARATUS

BACKGROUND OF THE INVENTION

The present invention relates to a nozzle through which a fluid such as a paste-like solder can escape and flow in a desired condition, and particularly to a structure of an outlet of such nozzle for a soldering apparatus.

When electronic devices, for example, are manufactured, as shown in FIG. 1, a metal electronic assembly (hereinafter simply referred to as "metal plate") P such as an electrostatic shield plate or a magnetic shield case is soldered vertically to the end face of a printed-circuit board or a chassis (hereinafter simply referred to as "base") B on which electronic circuits are fabricated at several joint portions in such a manner that the base B and the metal plate P make two or three surfaces which are perpendicular to each other. In FIG. 1, reference letters S denote solder mass obtained after the whole of the assembly with the solders coated thereon. The solder S has been heated in a furnace at a high temperature and soldered in next process.

In general, this paste-like solder is adhered or coated by using a nozzle 10 shown in FIGS. 2A and 2B.

As shown in FIGS. 2A and 2B, the nozzle 10 comprises a nozzle body 12 of a straight pipe shape, a supply opening 11 formed with the nozzle body 12, a tip end portion 13, and an outlet 14 formed by cutting the tip end portion 13 of the nozzle body 12 at an angle of 45°, for example.

When the paste-like solder S is coated on an assembled joined member so as to form two vertical surfaces, i.e., over two surfaces including a corner portion C of the base B and the metal plate P by using the nozzle 10, one side surface 12B of the nozzle body 12 is brought in contact with the surface of the metal plate P and the tip end portion 13 of the nozzle 10 is brought in contact with the surface of the base B in such a manner that the outlet 14 is opposed to the corner portion C (see FIG. 3A).

Accordingly, as shown in FIG. 3A, although the cut surface of the tip end portion 13 is opposed at an inclination angle of 45° to the corner portion C of the base B and the metal plate P united so as to form the two surfaces perpendicular to each other, the direction in which the paste-like solder pressured out by a squeegee (not shown) from the outlet 14 is the direction same as the direction in which the paste-like solder S guided by an inner wall 12A of the nozzle body 12 flows, as shown by an arrow Y in FIG. 3A. Initially, the paste-like solder S directly flows toward the surface of the base B. Then, the paste-like solder S that was brought in contact with the surface of the base B is pushed toward the corner portion C, whereafter it is accumulated over the two surfaces including the corner portion C by a necessary amount (see FIG. 3B).

However, because the base B is warped, the nozzle 10 is floated or a jig has a defect, a fluctuation of dimension occurs between the tip end portion 13 of the nozzle 10 and the surface of the base B or between the one side surface 12B of the nozzle 10 and the surface of the metal plate P. As a result, it is frequently observed that the paste-like solder S cannot be satisfactorily coated on the corner portion C.

Specifically, FIG. 4A shows the state in which a relatively large gap G exists between the tip end portion 13 of the nozzle 10 and the base B due to a fluctuation of dimension between the tip end portion 13 of the nozzle 10 and the base B. When the paste-like solder is coated in the state shown in FIG. 4A, the paste-like solder that flowed from the outlet 14 is dropped onto the base B and cannot flow toward the direction of the corner portion C. As a result, the paste-like solder mass S thus escaped is accumulated in the place away from the corner portion C and remains accumulated on the surface of the base B as shown in FIG. 4B.

When the paste-like solder is pushed out from the nozzle 10 by the squeegee, if a flat-type squeegee is used, a speed at which the paste-like solder flows from the outlet 14 of the nozzle 10 decreases as compared with the case that a roller-type squeegee is used. As a consequence, the paste-like solder thus escaped becomes difficult to flow toward the corner portion C. Therefore, the metal plate P cannot be soldered to the base B. There is then the possibility that a poor soldering will occur.

If the paste-like solder is coated when a relatively large gap G is produced between the one side surface 12B of the nozzle 10 and the surface of the metal plate P between a fluctuation of a dimension caused between the one side surface 12B of the nozzle 10 and the surface of the metal plate P as shown in FIG. 5A, similarly, then the paste-like solder flowed from the outlet 14 is dropped onto the base B and cannot flow toward the direction of the corner portion C. As a result, the paste-like solder mass S thus escaped is accumulated in the place away from the corner portion C and remains accumulated on the surface of the base B as shown in FIG. 5B. As a consequence, the paste-like solder thus escaped becomes difficult to flow toward the corner portion C. Therefore, the metal plate P cannot be soldered to the base B. There is then the possibility that a poor soldering will occur.

When the paste-like solder is coated and accumulated by using the nozzle 10, it is frequently observed that the above-mentioned disadvantage of such accumulated solder occurs. As a consequence, after the paste-like solder was coated and accumulated, the user should always inspect the soldered part and correct a poor soldered part if any.

SUMMARY OF THE INVENTION

It is therefore an object of the present invention to provide a nozzle in which even when a base is warped, a nozzle is floated or a jig is defective or a speed at which a paste-like solder flows from an outlet of the nozzle is low, a paste-like solder can reliably be coated and soldered onto a joined member to be soldered, i.e., a plurality of surfaces of two or more surfaces including a joined corner of a metal plate and a base.

According to the present invention, there is provided a nozzle which is comprised of a nozzle body of a cylindrical pipe shape having a supply opening formed therein through which a fluid flows, in which an inner wall length of a tip end portion of the cylindrical pipe is selected in such a manner that one side portion side is reduced in length and an opposite portion side opposing the one side portion side is increased in length and an outlet with a sunken opening is formed by progressively approaching an inner wall surface of the other side portion to the inner wall surface of the one side portion side so that a fluid to be escaped flows in an oblique direction different from a direction in which a fluid guided by the nozzle body portion flows.

According to the present invention, the pipe of the side portion side with a short length has a flat surface extended in the length direction and a tip end surface of the pipe of the other side portion side with a longer length is formed by a flat surface which is at substantially a right angle relative to the flat surface.

Therefore, with the nozzle according to the present invention, even when the base is warped, the nozzle is floated or the jig is defective, the paste-like solder from the outlet can flow in the oblique direction different from the direction in which the paste-like solder guided by the nozzle body portion flows. Furthermore, even when a speed at which the paste-like solder flows from the outlet of the nozzle is low, the outlet is formed with the sunken opening so that the flowing speed of the paste-like solder can increase a little. Therefore, the paste-like solder can reliably be coated and soldered to a plurality of surfaces of more than two surfaces including a joint portion of a metal plate and a base.

Further, according to the present invention, there is provided a soldering apparatus for injecting and coating a paste-like solder on a joined portion of electronic assemblies. This soldering apparatus is comprised of a nozzle body of a straight-shaped pipe through which a paste-like solder flows, a nozzle tip end portion formed at a tip end of the pipe and which is cut in the oblique direction so as to open a solder injection direction, and a paste-like solder introducing means formed near the nozzle tip end portion and directing the injection direction of the paste-like solder flowing therefrom into the opening direction.

Furthermore, according to the present invention, the the paste-like solder introducing means is formed of an inner wall surface near the opening portion of the nozzle tip end portion.

BRIEF DESCRIPTION OF THE DRAWINGS

FIGS. 3A and 3B are views used to show the manner in which a paste-like solder is coated and soldered at a joined corner portion of a metal plate and a base by using the nozzle shown in FIGS. 2A and 2B in a preferable condition, wherein FIG. 3A is a cross-sectional side view illustrating the state that the nozzle is contacted with the corner portion, and FIG. 3B is a cross-sectional side view illustrating the state that the paste-like solder is coated and soldered at the corner portion in the desired condition;

FIGS. 4A and 4B are views used to show the manner in which a paste-like solder is coated and soldered at a joined corner portion of a metal plate and a base by using the nozzle shown in FIGS. 2A and 2B in an undesirable condition, wherein FIG. 4A is a cross-sectional side view illustrative of the state that a tip end portion of the nozzle is floated from the surface of the base, and FIG. 4B is a cross-sectional side view illustrative of the state that the paste-like solder is not coated and soldered on the joined corner portion;

FIGS. 5A and 5B are views used to show another example of the manner in which a paste-like solder is coated and soldered at a joined corner portion of a metal plate and a base by using the nozzle shown in FIGS. 2A and 2B in an undesirable condition, wherein FIG. 5A is a cross-sectional side view illustrative of the state that one side surface side of the nozzle is floated from the surface of the metal plate, and FIG. 5B is a cross-sectional side view illustrative of the state that the paste-like solder is not coated and soldered on the joined corner portion;

FIGS. 8A to 8C are cross-sectional views used to explain an action obtained when a paste-like solder is coated by using the nozzles shown in FIGS. 6A to 6C and FIGS. 7A to 7C, wherein FIG. 8A is a cross-sectional view used to explain an action obtained when a gap exists between a tip end portion of a nozzle and the surface of a metal plate, FIG. 8B is a cross-sectional view used to explain an action obtained when a gap exists between one side surface of a nozzle and a metal plate, and FIG. 8C is a cross-sectional view used to explain an action obtained when a paste-like solder is coated and soldered by the nozzles according to the present invention.

DETAILED DESCRIPTION OF THE PREFERRED EMBODIMENTS

A nozzle according to the present invention will hereinafter be described with reference to FIGS. 6A to 6C through FIGS. 8A to 8C.

Figure 1:
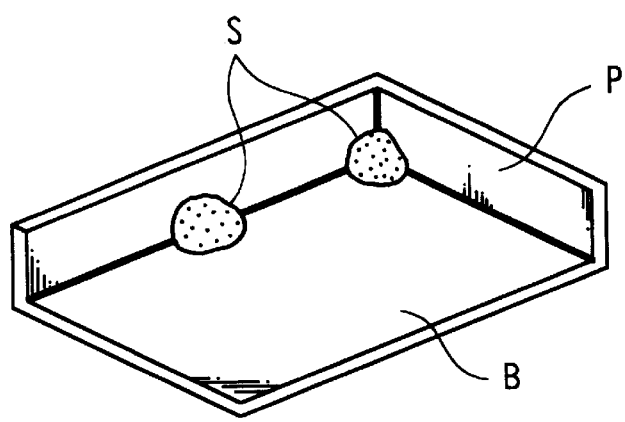
FIG. 1 is a fragmentary perspective view illustrating a manner in which a plurality of metal plates are soldered on the surface of a base at several corner portions over two or three surfaces perpendicular to each other.
Figure 2A:
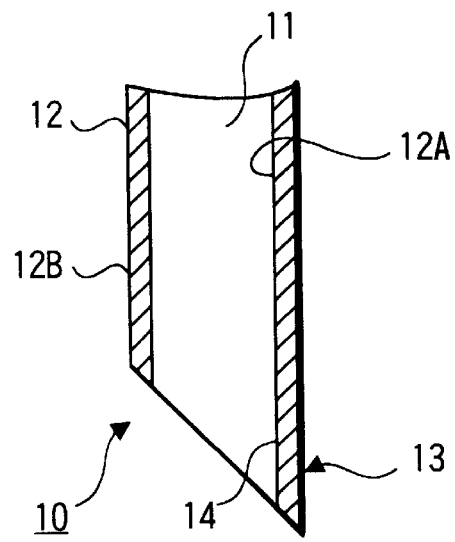
FIG. 2A is a cross-sectional side view illustrative of a structure of a nozzle.
Figure 2B:
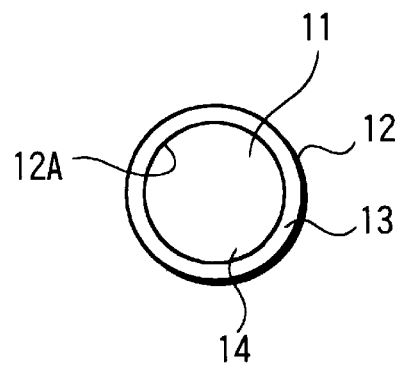
FIG. 2B is a bottom view thereof.
Figure 3A:
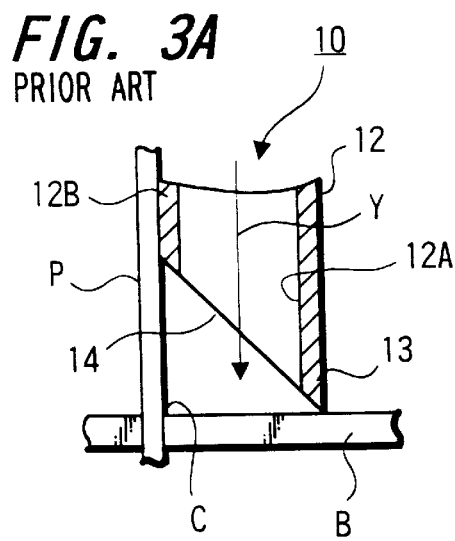
Figure 3B:
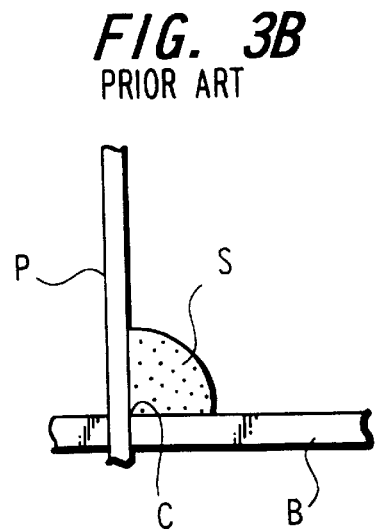
Figure 4A:
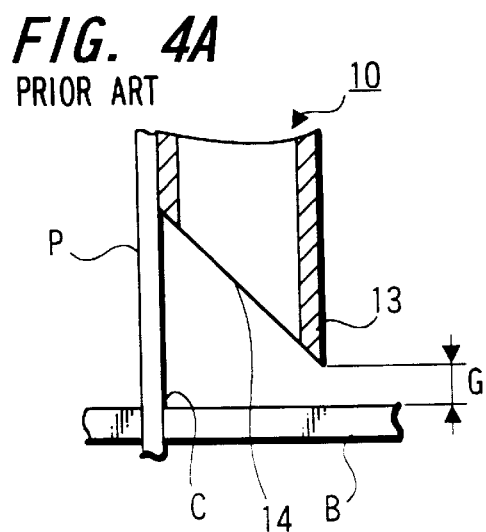
Figure 4B:
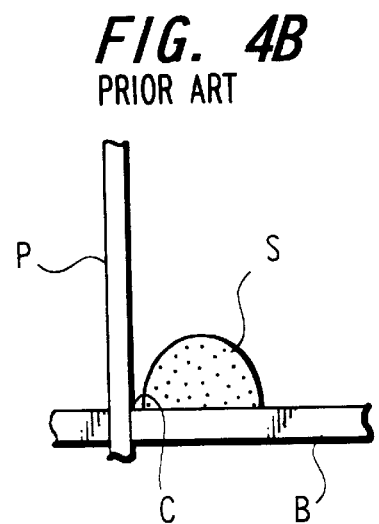
Figure 5A:
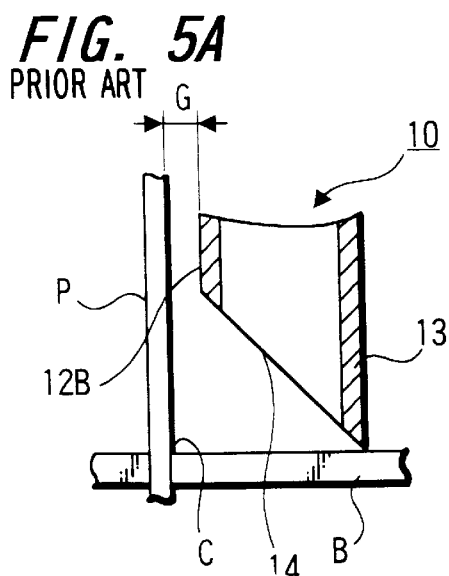
Figure 5B:
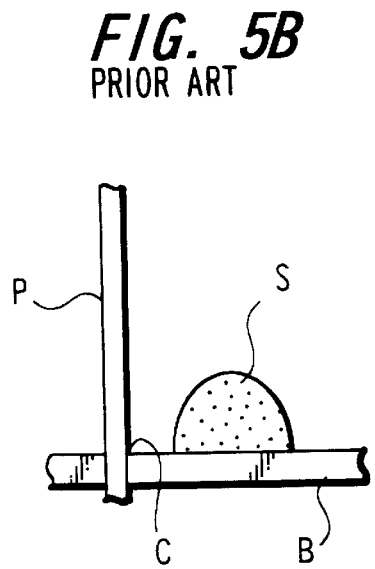
Figure 6B:
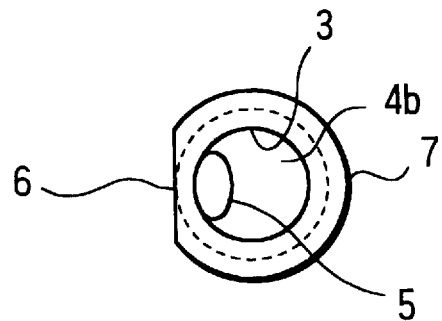
FIG. 6B is a top view thereof.
Figure 6A:
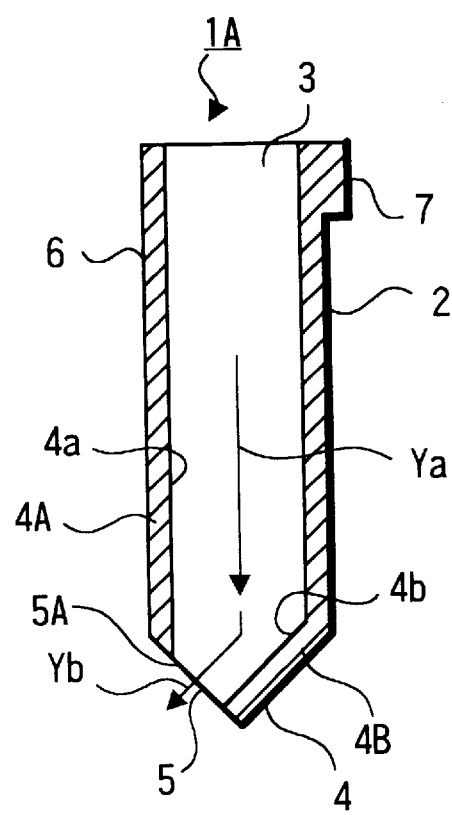
FIG. 6A is a cross-sectional side view showing a structure of a nozzle according to a first embodiment of the present invention.
Figure 6C:
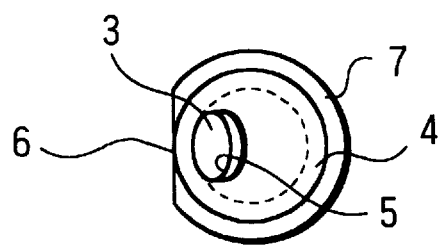
FIG. 6C is a bottom view thereof.
Figure 7B:
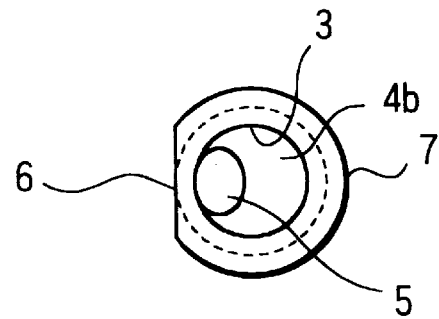
FIG. 7B is a top view thereof.
Figure 7A:
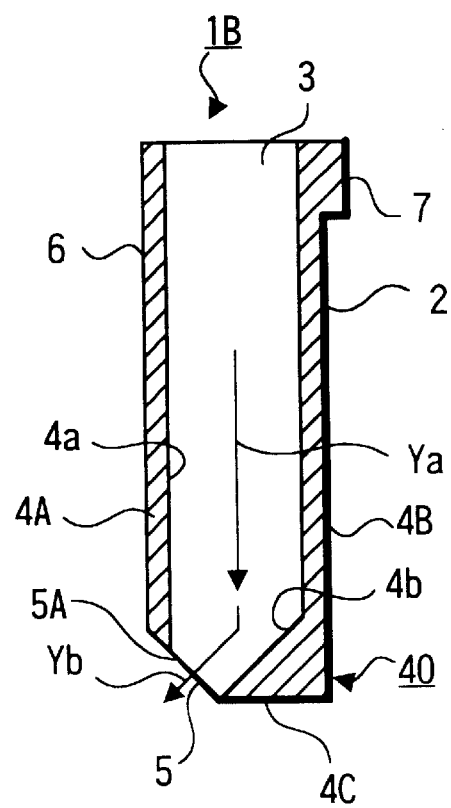
FIG. 7A is a cross-sectional side view showing a structure of a nozzle according to a second embodiment of the present invention.
Figure 7C:
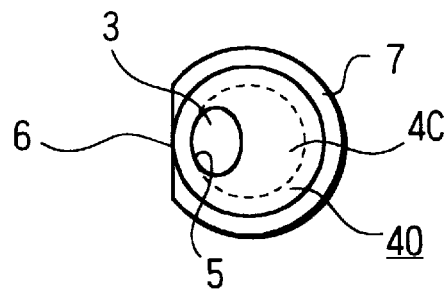
FIG. 7C is a bottom view thereof.
Figure 8A:
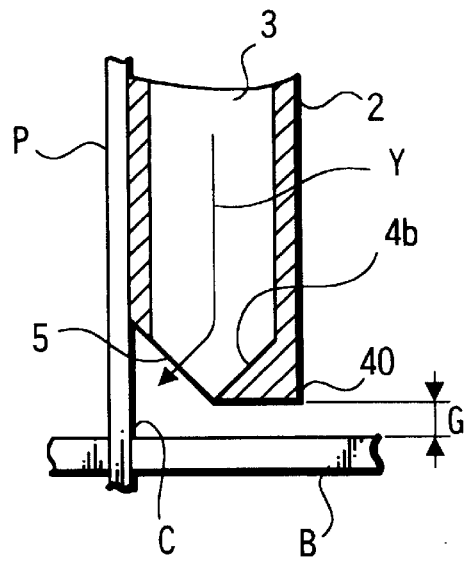
Figure 8B:
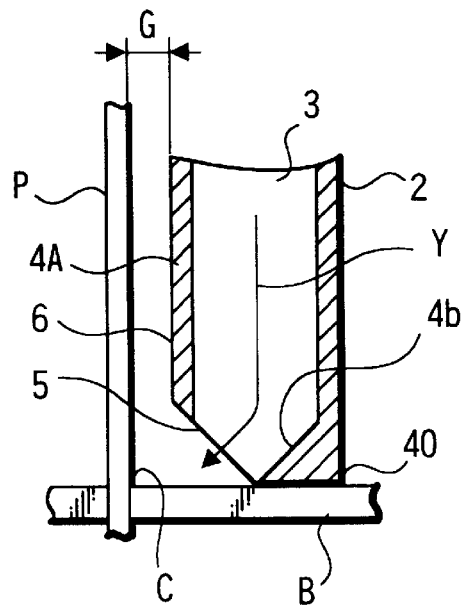
Figure 8C:
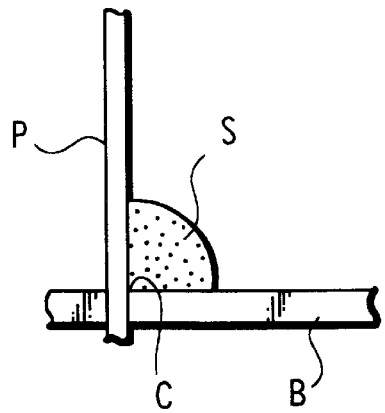

FIGS. 6A to 6C are views showing a structure of a nozzle according to a first embodiment of the present invention. FIG. 6A is a cross-sectional side view showing a structure of a nozzle according to a first embodiment of the present invention, FIG. 6B is a top view thereof, and FIG. 6C is a bottom view thereof. FIGS. 7A to 7C are views showing a structure of a nozzle according to a second embodiment of the present invention. FIG. 7A is a cross-sectional side view showing a structure of a nozzle according to a second embodiment of the present invention, FIG. 7B is a top view thereof, and FIG. 7C is a bottom view thereof. FIGS. 8A to 8C are cross-sectional views used to explain an action obtained when a paste-like solder is coated by using the nozzles shown in FIGS. 6A to 6C and FIGS. 7A to 7C, wherein FIG. 8A is a cross-sectional view used to explain an action obtained when a gap exists between a tip end portion of a nozzle and the surface of a metal plate, FIG. 8B is a cross-sectional view used to explain an action obtained when a gap exists between one side surface of a nozzle and a metal plate, and FIG. 8C is a cross-sectional view used to explain an action obtained when a paste-like solder is coated and soldered by the nozzles according to the present invention.

Initially, a structure of a nozzle according to the present invention will be described with reference to FIGS. 6A to 6C.

A nozzle, generally depicted at reference numeral 1A in FIG. 6A, includes a nozzle body 2 formed of a cylindrical pipe with a uniform thickness and a supplying opening 3 formed within the inside of the nozzle body 2. A paste-like solder flows through the supplying opening 3 and is escaped to the outside. An inner wall length of a tip end portion 4 of the nozzle body 2 is selected in such a manner that one side portion 4A is reduced in length and an opposite portion 4B opposing the one side portion 4A is increased in length. Moreover, an inner wall surface 4b of the opposite portion 4B is progressively approached to an inner wall surface 4a of the one side portion 4A so as to form an inclined surface with an inclination angle of 45°. Thus, an outlet 5 whose opening 5A is smaller than the inner diameter of the nozzle body 2 is formed at the tip end portion 4.

A flat surface 6 is formed around an outer peripheral surface of the one side portion 4A of the nozzle body 2 over the full length of the nozzle body 2 in the length direction. A brim 7 is formed around the outer periphery of the upper end portion of the nozzle body 2.

The brim 7 is used to attach the nozzle 1A to a solder supplying apparatus body (not shown). The flat surface 6 is used as a reference plane with which there is contacted with a jig or an attachment portion of the solder supplying apparatus body used when the paste-like solder is accurately coated on the portion to be soldered.

When the above-mentioned nozzle 1A is used, the paste-like solder is escaped from the outlet 5 and the paste-like solder to be coated can be introduced into an oblique direction (shown by an arrow Yb in FIG. 6A) different from a direction (shown by an arrow Ya in FIG. 6A) in which the paste-like solder guided by the nozzle body portion 2 flows, in this embodiment, in the direction with an inclination angle of 45°, i.e., into the direction of the one side portion 4A of the tip end portion 4 of the nozzle body 2.

While the inner wall surface 4b of the tip end portion 4 is formed with the inclination angle of 45° as described above, if the nozzle 1A is used when the metal plate P to be soldered is joined to the surface of the base B in substantially the vertical state, then the paste-like solder S can be coated and soldered to the corner portion C most effectively. Even when the metal plate P to be soldered is not joined to the surface of the base B in the vertical state, if this nozzle 1A is used, then the paste-like solder S flowing from the outlet 5 can abut against the inner wall surface 4b and the flowing direction of the paste-like solder S can be changed into the direction of the corner C. Thus, the paste-like solder can be used effectively.

However, the above-mentioned inclination angle should preferably be selected to be such one that the paste-like solder can be coated and soldered most effectively in accordance with a mechanical structure of a soldered part.

A nozzle 1B according to a second embodiment shown in FIGS. 7A to 7C is an improvement of the nozzle 1A shown in FIGS. 6A to 6C, and the structure of the nozzle 1B is substantially the same as that of the nozzle 1A. Therefore, in FIGS. 7A to 7C, elements and parts identical to those of FIGS. 6A to 6C are marked with the same references and need not be described in detail.

From a structure standpoint, the nozzle 1B is different from the nozzle 1A in a tip end portion 40. The lower end portion of the opposite portion 4B opposing the one side portion 4A of the nozzle body 2 of the nozzle 1A is formed by a relatively wide horizontal plane 4C which is substantially perpendicular to the flat surface 6 of the one side portion 4A.

If the above-mentioned nozzle 1B is used, then similarly to the nozzle 1A, the paste-like solder flowing from the outlet 5 can be introduced into the oblique direction (shown by the arrow Yb) different from the flowing direction (shown by the arrow Ya) of the paste-like solder introduced by the nozzle body 2 portion. In addition, when the paste-like solder is coated and soldered on the corner portion C of the assembled part in which the metal plate P to be soldered is vertically joined to the surface of the base B, the flat surface 6 of the nozzle 1B can be vertically contacted with the vertical surface of the metal plate P and the jig. Accordingly, the nozzle 1B can be stably held by making one horizontal plane 4c contact with the surface of the substrate B.

With reference to FIGS. 8A to 8C, an action obtained when the paste-like solder S is coated and soldered by using the nozzle 1B according to the second embodiment to the corner portion C of the assembled part in which the metal plate P to be soldered is joined vertically to the surface of the base B will be described.

FIG. 8A illustrates the manner in which the tip end portion 40 of the nozzle 1B is floated from the surface of the base B to produce a small gap G due to the aforesaid causes.

Even under the above-mentioned coated state, if the nozzle 1B according to the present invention is used, then the flowing direction in which the paste-like solder S guided by the supplying opening 3 of the nozzle body 2 portion flows in the lower direction is blocked by the inner wall surface 4b of the tip end portion 40 and is forced to be changed to the oblique direction different from the flowing direction, e.g., the direction with an inclination angle of 45° as shown by an arrow Y in FIG. 8A. Thus, the paste-like solder can reliably flow with a relatively large power from the hollow outlet 5 so that, as shown in FIG. 8C, the paste-like solder mass S of a predetermined amount can be coated on and soldered to the corner portion C in a satisfactory condition.

Furthermore, as shown in FIG. 8B, even when the gap G is produced between the flat surface 6 formed on the outer peripheral surface of the one side portion 4A side of the nozzle 1B and the surface of the metal plate P, owning to the action of the inner wall surface 4b of the tip end portion 40, as shown in FIG. 8C, the paste-like solder S of the predetermined amount can be coated on and soldered to the corner portion C in a satisfactory condition.

While the nozzles through which the paste-like solder escapes and flows have been described so far, the nozzles according to the present invention are not limited to the nozzle for coating the paste-like solder and may be used as a nozzle through which a fluid such as adhesive or caulking agent escapes and flows. Accordingly, the members for forming the corner portion are not limited to the base B and the metal plate P and other proper materials may be used.

As described above, according to the nozzle of the present invention, since the tip end portion of the nozzle body is formed with the inclination angle at which a flow of a fluid is directed, even when the base is warped, the nozzle is floated or the jig is defective, a fluid can stably flow from the outlet of the nozzle over a plurality of surfaces of two surfaces or more including the joined corner portion of the joined member assembled with each other with a certain angle therebetween. Furthermore, even when a speed at which a fluid flows in the nozzle body portion is slow, the outlet is formed of the sunken opening so that the speed at which a fluid flows can increase a little. Therefore, the paste-like solder can reliably and efficiently be coated on the joined corner portion composed of a plurality of joint members.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A nozzle comprising:
   a nozzle body of a cylindrical pipe shape having a supply opening formed therein through which a fluid flows, in which an inner wall length of a tip end portion of said cylindrical pipe is selected in such a manner that a first side portion is reduced in length and a second side portion opposing said first side portion is increased in length and an outlet with a sunken opening is formed by progressively approaching an inner wall surface of said first side portion so that a fluid to be discharged flows in an oblique direction different from a direction in which a fluid guided by said nozzle body portion flows wherein a flat surface is formed around an outer peripheral surface of said first side portion of said nozzle body portion over the full length of said nozzle body portion in the length direction to provide a reference plane for the fluid to be discharged.

2. A nozzle as claimed in claim 1, in which a direction in which a fluid flowing from said outlet is directed at an angle of about 45° relative to a direction in which a fluid guided by said nozzle body portion flows.

3. A nozzle as claimed in claim 1, in which said pipe of said one side portion side with a short length has a flat surface extended in the length direction and a tip end surface of said pipe of the other side portion side with a longer length is formed by a flat surface which is at substantially a right angle relative to said flat surface.

4. A soldering apparatus for ejecting and coating a paste-like solder on a joined portion of electronic assemblies comprising:

a nozzle body of a straight-shaped pipe through which a paste-like solder flows in which an inner wall length of a tip end portion of said nozzle body includes a first side portion which is reduced in length and a second side portion opposing said first side portion is increased in length wherein a flat surface is formed around an outer peripheral surface of said first side portion of said nozzle body over the full length of said nozzle body portion in the length direction to provide a reference plane for the solder to be ejected;

a nozzle tip end portion formed at a tip end of said pipe and which is cut in the oblique direction so as to open a solder injection direction; and paste-like solder introducing means formed near said nozzle tip end portion and directing said injection direction of said paste-like solder flowing therefrom into an opening portion.

5. A soldering apparatus as claimed in claim 4, in which said paste-like solder introducing means is formed of an inner wall surface near said opening portion of said nozzle tip end portion.

* * * * *